(12) United States Patent
Masuda

(10) Patent No.: US 6,818,995 B2
(45) Date of Patent: Nov. 16, 2004

(54) SEMICONDUCTOR DEVICE AND METHOD OF MANUFACTURING THE SAME

(75) Inventor: Kazuhiro Masuda, Suwa (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 10/345,890

(22) Filed: Jan. 16, 2003

(65) Prior Publication Data

US 2003/0178640 A1 Sep. 25, 2003

(30) Foreign Application Priority Data

Jan. 17, 2002 (JP) ........................................ 2002-008714

(51) Int. Cl.[7] .............................................. H01L 23/48
(52) U.S. Cl. ...................... 257/758; 438/296; 438/694; 438/710; 438/712; 438/720
(58) Field of Search ................................ 438/694, 710, 438/712, 720, 296

(56) References Cited

U.S. PATENT DOCUMENTS 6,605,512 B2 * 8/2003 Kiyota ........................ 438/296
6,605,540 B2 * 8/2003 Ali et al. ...................... 438/694

* cited by examiner

Primary Examiner—David Nelms
Assistant Examiner—Mai-Huong Tran
(74) Attorney, Agent, or Firm—Harness, Dickey & Pierce, P.L.C.

(57) ABSTRACT

A Cu wiring member containing Cu as the main component is embedded in an interlayer dielectric film among multiple wiring layers accompanied with a coating of a barrier metal and an upper diffusion barrier layer formed thereon. The interlayer dielectric film is composed of a first dielectric film that forms a major part thereof and a second dielectric film that is provided adjacent to the first dielectric film and forms side walls of the Cu wiring member. The first dielectric film and the second dielectric film have mutually different etching selection ratios. When a wiring layer in an upper layer is connected to the Cu wiring member through the via hole VH formed in the first dielectric film by etching, a substantial matching margin can be expected.

6 Claims, 7 Drawing Sheets

SEMICONDUCTOR DEVICE AND METHOD OF MANUFACTURING THE SAME

TECHNICAL FIELD

The present invention relates to multiple layered structures of semiconductor devices, and more particularly to semiconductor devices using damascene structures, which can accommodate higher integration, further miniaturization, lower resistances and higher operation speeds, and methods for manufacturing the same.

BACKGROUND

For semiconductor integrated circuit devices, there is a tendency to use low resistance Cu wiring material that can accommodate higher circuit integrations, lower voltage power supplies and higher operation speeds pursued in recent years. The use of a damascene method that includes embedding wiring material and chemical mechanical polishing (CMP) has become the main stream in processes with Cu wiring material.

For example, a lithography technique is used to selectively form an opening in an interlayer dielectric film to expose contact region. A trench that is to become a wiring region may be formed with the contact region. Then, the contact region is coated with barrier metal material such as Ti/TiN stacked layers, TaN, WN or the like by a sputter method.

Next, a Cu wiring material is embedded. For this purpose, a sputtering of a Cu seed layer or a deposition of Cu by an electrolytic plating method is generally practiced. By performing such a method, a Cu wiring material is deposited on the contact region and a region including a trench (wring trench) that is to become a wiring region. Then, a chemical mechanical polishing (CMP) technique is conducted to form a structure in which the Cu wiring material is embedded in only necessary wiring sections.

FIG. 11 shows a cross-sectional view of a conventional multiple wiring layer structure with Cu wiring material. A Cu wiring member 41 in a lower layer connects through a contact region to a Cu wiring member 42 in an upper layer. Each of the Cu wiring members is coated on its circumference with a barrier metal BM having an appropriate thickness as a base layer. By this, diffusion of Cu into an interlayer dielectric film 40 (402) and the contact region is prevented.

Also, for forming a wiring trench 421, a stopper film ES, which can define an etching selection ratio with respect to the interlayer dielectric film 40, is formed. This plays a role in accurately forming a bottom section of the wiring trench 421. For example, when the interlayer dielectric film 40 is a silicon oxide film, the stopper film ES may be composed of, for example, a silicon nitride film.

Further, before forming a via hole 422 that is to become a contact region with respect to an upper layer, a diffused barrier layer 413 is also provided on the Cu wiring member 41. The diffused barrier layer 413 may be, for example, a silicon nitride film in the above example. By this, diffusion of Cu into an interlayer dielectric film 402 (silicon nitride film) to be deposited next or the like is prevented.

In the structure described above, the barrier metal BM having an appropriate thickness is coated as a base for the Cu wiring member to prevent Cu from diffusing into the contact region. Since the barrier metal material has a higher resistance than the Cu wiring material, the barrier metal material is currently formed as thin as possible.

FIG. 12 shows a cross-sectional view illustrating problems with the structure shown in FIG. 11. The same reference numbers are assigned for the same sections shown in FIG. 11. Due to advanced miniaturization, a contact region CTA is reduced. There is a high risk that etching positions at the contact region CTA may partially deviate from one another due to a slight matching deviation in the photolithography process. As for the example shown in the figure, voids may be generated due to excessive etching, Cu may diffuse due to a lack of the barrier metal, there is a possibility of increased defects, and there is a possibility of a short-circuit among adjacent wirings.

The present invention has been made in view of the problems discussed above, and one object is to provide a semiconductor device having a highly reliable connecting wiring structure with minute multiple wiring layers composed of embedded Cu wiring material which form an integrated circuit, and a method of manufacturing the same.

SUMMARY

A semiconductor device in accordance with the present invention pertains to a semiconductor device formed from multiple wiring layers having predetermined metal wiring members arranged therein, and is characterized in comprising: a dielectric film between layers of the multiple wiring layers, the dielectric layer having a first dielectric film composing a major part thereof and having a first etching selection ratio, and a second dielectric film at least adjacent to the first dielectric film, composing an edge section side wall of a connecting region of the metal wiring layers and having a second etching selection ratio.

By the semiconductor device of the present invention described above, a second dielectric film, which has an etching selection ratio different from that of the first dielectric film, is disposed at the edge section side wall of a connecting region of the metal wiring layers. As a result, when forming metal wiring members, and when a wiring layer in an upper layer is connected to a wiring layer in a lower layer through a via hole formed in the first dielectric film by etching, an etching deviation at an edge section of the lower wiring layer can be compensated by the amount of the thickness of the second dielectric film.

In view of the relations between the first dielectric film and the second dielectric film, a variety of combinations of these films can be possible. First, it is characterized in that the second dielectric film may be selected from nitride films or oxide films. Also, a variety applications are possible in selecting the first dielectric film. For example, any one of an inorganic film, an organic film with a low dielectric constant, an inorganic film with a low dielectric constant and a porous film with a low dielectric constant having pores introduced in the film may be used.

Further, it is characterized in that a barrier metal is present in a predetermined region between the second dielectric film and the metal wiring member, which is effective when the second dielectric film having a poor capability to prevent diffusion of the metal wiring member is selected. Even when the second dielectric film has a poor capability to prevent diffusion of the metal wiring member, an addition of the barrier metal improves the capability of preventing diffusion of the metal wiring member into the first dielectric film.

More preferably, it is characterized in that the barrier metal is provided between the second dielectric film except a via-contact side wall at the connecting region of the metal wiring members and the metal wiring member. When the selected second dielectric film has a capability to prevent diffusion of the metal wiring member, the addition of the barrier metal may result in a higher resistance with respect to the via contact that has a narrow connecting area. Therefore, it is sufficient to provide the via-contact side wall only with the second dielectric film having a capability of preventing diffusion of the metal wiring member.

A method of manufacturing in accordance with the present invention pertains to a method of manufacturing a semiconductor device formed with circuit wirings including predetermined metal wiring members, and the method is characterized in comprising the steps of: forming a wiring region including an excess portion that is larger than a substantive wiring region by a predetermined measurement by selectively removing at least a first dielectric film having a first etching selection ratio; forming a second dielectric film having a second etching selection ratio such that at least the excess portion on a surface in the wiring region is embedded; conducting an anisotropic etching to leave the second dielectric film on a side wall including the excess portion of the wiring region; and embedding the wiring region with a metal wiring member to present a wiring structure.

By the method of manufacturing a semiconductor device in accordance with the present invention, in the wiring region including the excess portion, the second dielectric film is provided such that the excess portion is embedded, in other words, without narrowing the substantive wiring region. As a result, when forming metal wiring members, and when a wiring layer in an upper layer is connected to a wiring layer in a lower layer through a via hole formed in the first dielectric film by etching, an etching deviation at an edge section of the lower wiring layer can be compensated by the amount of the thickness of the second dielectric film.

Also, the step of forming the wiring region is characterized in providing a predetermined region having a configuration with a dual damascene structure, which is accompanied with forming a hole forming configuration toward a conductive region in a lower layer and forming a wiring trench.

Also, it is characterized in that the step of forming the wiring region is accompanied with forming a wiring trench, and further comprising the step of providing a predetermined region having a configuration with a dual damascene structure wherein, before forming the wiring trench, a hole forming configuration toward a conductive region in a lower layer is formed in advance, and the hole forming configuration is included in the wiring trench in the step of forming the wiring trench.

Also, it is characterized in that the step of forming the wiring region is accompanied with forming a wiring trench, and further comprising the step of providing a predetermined region having a configuration with a dual damascene structure wherein, after the step of forming the wiring trench, a hole forming configuration toward a conductive region in a lower layer is formed in the wiring trench.

It is characterized in that, before each of the wiring regions described above is embedded with the metal wiring member, the step of coating a barrier metal on a predetermined region including the second dielectric film is conducted. The coating of the barrier metal results in a higher resistance in the hole forming configuration that has a narrow connecting area. Therefore, the barrier metal may not necessarily be formed if the second dielectric film has a Cu diffusion preventing capability. In this respect, it is characterized in that the step of forming the wiring region is accompanied with forming a hole forming configuration toward a conductive region in a lower layer and a wiring trench, and it further comprises, after the step of forming the wiring region and before embedding the wiring region with the metal wiring member, the step of coating a barrier metal on a region including the wiring trench other than the hole forming configuration.

DETAILED DESCRIPTION

Figure 1:
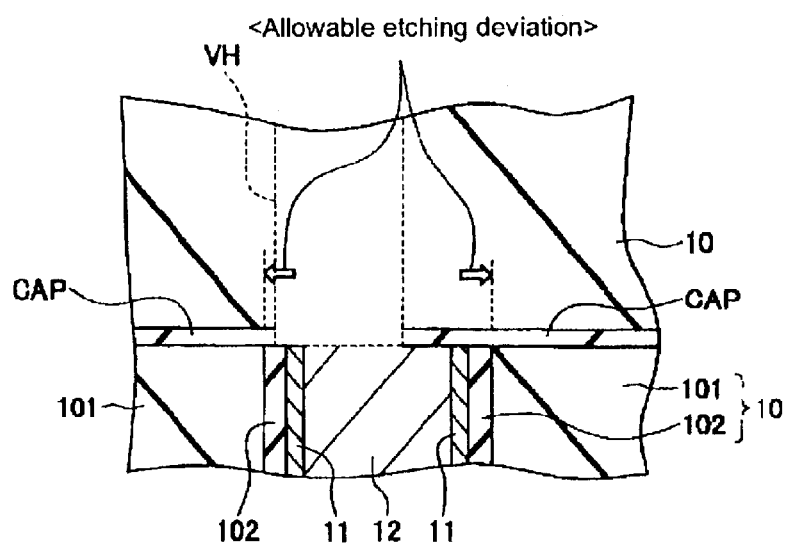
FIG. 1 shows a cross-sectional view of a semiconductor device in accordance with one embodiment of the present invention.

FIG. 1 shows a cross-sectional view of a semiconductor device in accordance with one embodiment of the present invention, and shows multiple wiring layers in a semiconductor integrated circuit formed on a semiconductor substrate. A Cu wiring member 12 containing Cu as the main component is embedded in the interlayer dielectric film 10 (101, 102) among the multiple wiring layers accompanied with a coating of a barrier metal 11 and an upper diffusion barrier layer CAP formed thereon.

The interlayer dielectric film 10 is composed of a first dielectric film 101 that forms a major part thereof and a second dielectric film 102 that is provided adjacent to the first dielectric film 101 and forms side walls of the Cu wiring member 12. The first dielectric film 101 and the second dielectric film 102 have mutually different etching selection ratios.

By the structure described above, when forming Cu wiring members in the multiple wiring layers, and when a wiring layer in an upper layer (not shown) is connected to the Cu wiring member 12 through a via hole VH formed in the first dielectric film 101 by etching, a substantial amount of matching margin can be expected. In other words, an etching deviation at an edge section of the Cu wiring member 12 can be compensated by the amount of the thickness of the second dielectric film 102.

A variety of combinations of the first dielectric film 101 and the second dielectric film 102 can be possible. When the second dielectric film 102 is a nitride film such as a silicon nitride film, any one of an ordinary inorganic film such as a silicon oxide film, an organic film with a low dielectric constant, an inorganic film with a low dielectric constant (i.e., an organic, or inorganic Low-k film) and a porous film with a low dielectric constant having pores introduced in the film may be used for the first dielectric film 101.

Further, if the structure is well arranged such that a nitride film as the second dielectric film 102 securely covers the circumference of the Cu wiring member 12, the formation of the barrier metal 11 can be omitted. Alternatively, by using a film with a low dielectric constant that has a very slow Cu diffusion rate, such as a BCB (Benzocyclobutene) film, as the first dielectric film 101, the formation of the barrier metal 11 can be omitted. Such omission of the formation of the barrier metal 11 would contribute to the reduction of resistance because only the Cu wiring member is filled in the via hole having a particularly narrow connection area.

Also, when the second dielectric film 102 is an oxide film such as a silicon oxide film, any one of an organic film with a low dielectric constant, an inorganic film with a low dielectric constant (i.e., an organic or inorganic Low-k film) and a porous film with a low dielectric constant having pores introduced in the film may be used for the first dielectric film 101.

Further, by using a film with a low dielectric constant that has a very slow Cu diffusion rate, such as a BCB (Benzocyclobutene) film, as the first dielectric film 101, the formation of the barrier metal 11 can be omitted. This would contribute to the reduction of resistance because only the Cu wiring member is filled in the via hole having a particularly narrow connection area.

Figure 8:
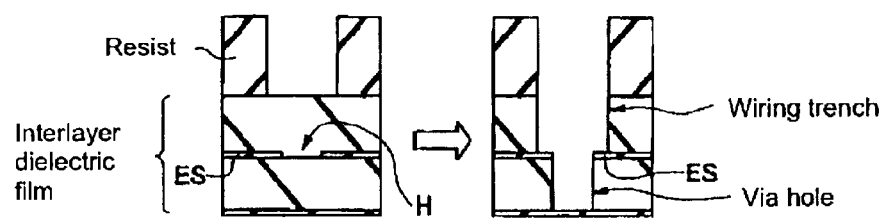
FIG. 8 shows a cross-sectional view of a portion of a first example in which a dual damascene structure is formed.
Figure 9:
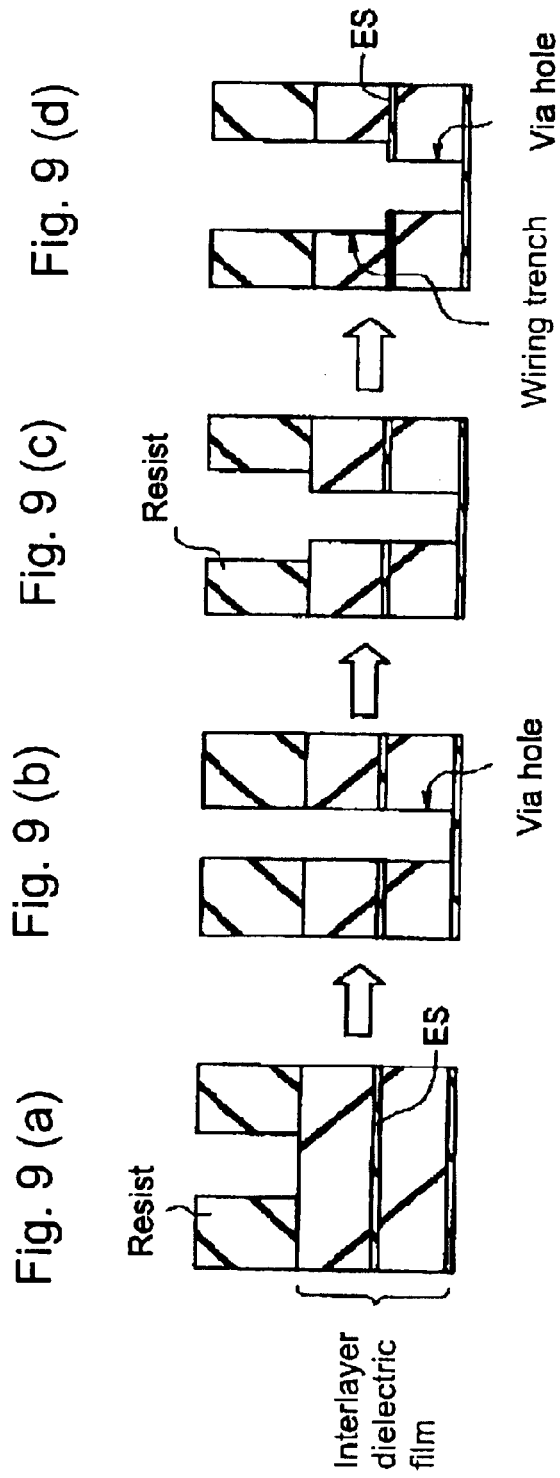
FIG. 9 shows a cross-sectional view of a portion of a second example in which a dual damascene structure is formed.
Figure 10:
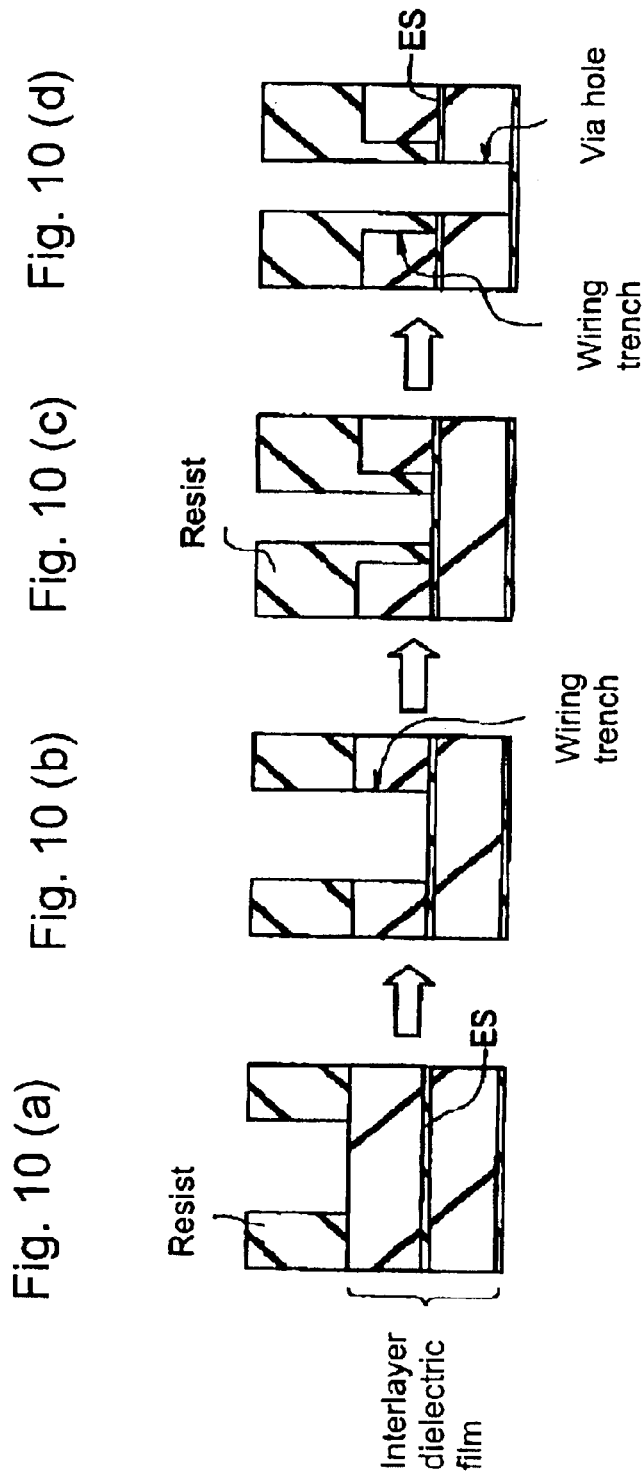
FIG. 10 shows a cross-sectional view of a portion of a third example in which a dual damascene structure is formed.
Figure 11:
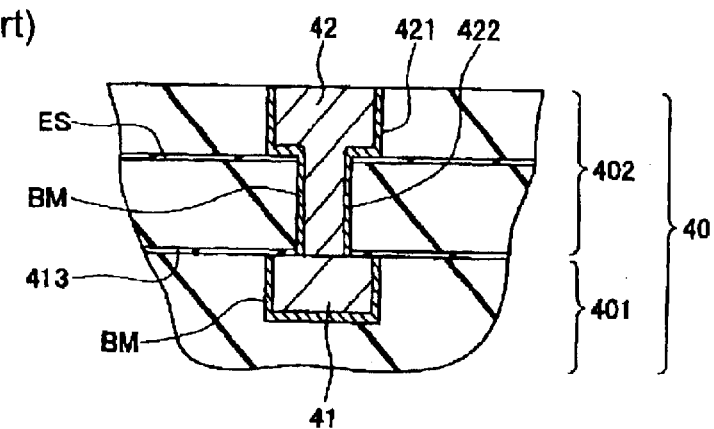
FIG. 11 shows a cross-sectional view of a conventional multiple wiring layer structure with Cu wiring material.
Figure 12:
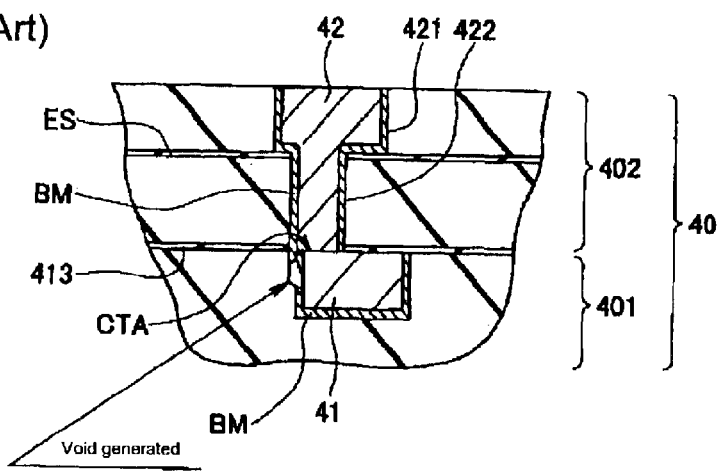
FIG. 12 shows a cross-sectional view illustrating problems with the structure shown in FIG. 11.

FIGS. 2–6 show cross-sectional views of sections in a method of manufacturing a semiconductor device in process order in accordance with a first embodiment of the present invention. Also, FIGS. 8–10 show cross-sectional views of an example in which a dual damascene structure is formed.

Figure 2:
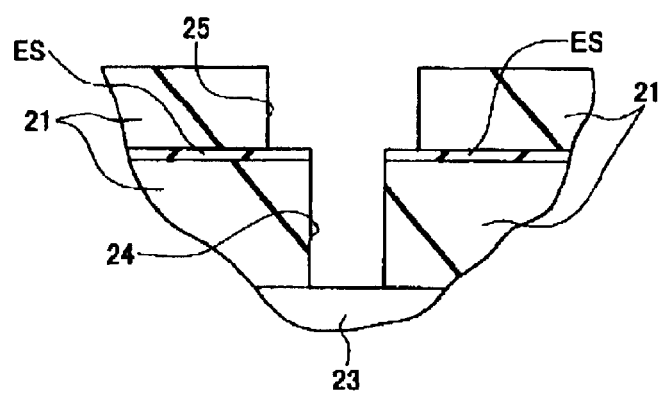
FIG. 2 shows a first cross-sectional view of a portion of a method of manufacturing a semiconductor device in accordance with an embodiment of the present invention.

As shown in FIG. 2, a contact region 23 is formed in a predetermined region in a layer below an interlayer dielectric film (first dielectric film) 21, which form an integrated circuit on a semiconductor substrate. The contact region 23 may be a wiring layer or a diffusion layer.

The interlayer dielectric film (first dielectric film) 21 may be formed from a silicon oxide film formed by a CVD method (a so-called TEOS oxide film) that is a typical inorganic film, or a film with a low dielectric constant (Low-k). For example, it may be an organic film with a low dielectric constant formed by a coating method (e.g., siloxane, organic polymer (without Si—O radicals) or porous material), an inorganic film with a low dielectric constant formed by a coating method (e.g., siloxane having Si—O radicals, or porous material), or a SiOF film formed by a CVD method.

A via hole 24 that exposes the contact region 23 and a wiring trench 25 that connects to the via hole 24 are formed in the interlayer dielectric film (the first dielectric film) 21. To provide a dual damascene structure, one of the methods shown, for example, in FIGS. 8–10 can be used.

More specifically, one of a self-alignment method in which an opening H that is to become a via hole is formed in advance in an etching stopper film ES as shown in FIG. 8, a pre-via forming method in which a via hole section is formed in advance and the via hole section is included in a wiring trench when it is formed as shown in FIG. 9, and a pre-trench forming method in which a wiring trench is formed in advance, and a via hole is formed in the wiring trench as shown in FIG. 10.

It is noted that, in the pre-via forming method shown in FIG. 9 and the pre-trench forming method shown in FIG. 10, an etching stopper film ES may not be formed. Also, a method using double hard masks may be used and the self-alignment method in which an etching stopper film ES is omitted (not shown in the drawings). More specifically, a mask layer for via holes and a mask layer for wiring trenches are placed in layers on an interlayer dielectric film, and they are patterned by using a lithography technique, respectively. The two mask layers have mutually different etching selection ratios, which are used to form the via holes and wiring trenches. Although various other methods in which an etching stopper film ES is omitted may be possible, this example is provided with a structure with an etching stopper film ES being present.

When a via hole and a wiring trench that connects to the via hole are formed as described above, the photolithography technique is controlled, in other words, the measurements of resists are controlled, to thereby form a wiring region that includes an excess portion that is larger in size by about 10–20% than a substantive wiring region.

Figure 3:
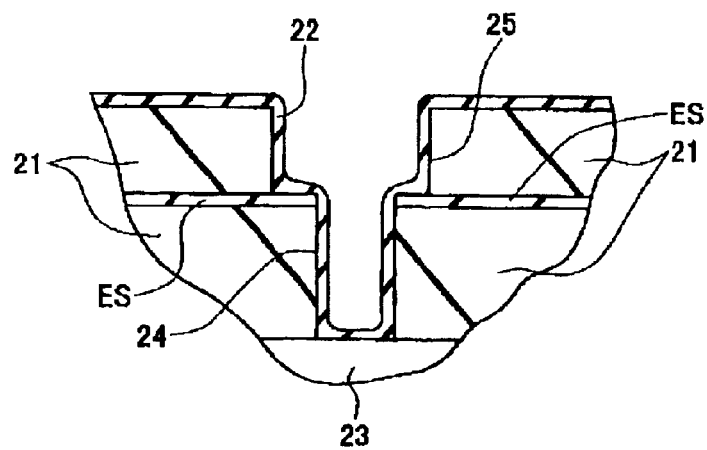
FIG. 3 shows a second cross-sectional view, succeeding FIG. 2, of a portion of the method of manufacturing a semiconductor device in accordance with an embodiment of the present invention.

Next, as shown in FIG. 3, a dielectric film (second dielectric film) 22 is formed by a plasma CVD (chemical vapor deposition) method such that the excess portion is embedded. The dielectric film 22 may be one that causes an etching selection ratio with respect to at least the first dielectric film 21. Here, the dielectric film 22 may typically be a silicon nitride film that is generally recognized for its Cu diffusion prevention capability. However, depending on the first dielectric film 21 combined, a silicon oxide film may also be used.

Figure 4:
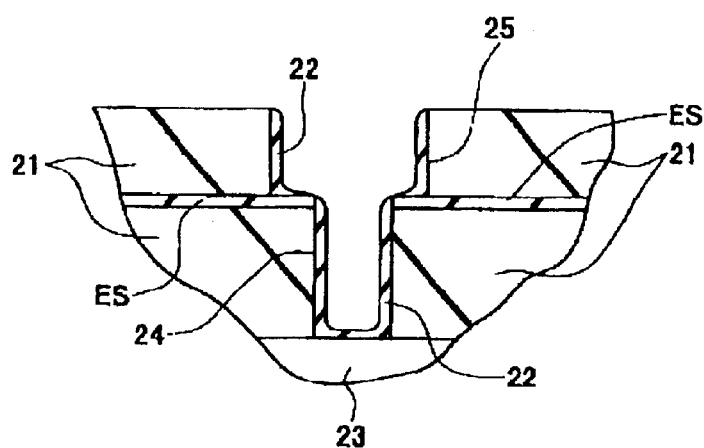
FIG. 4 shows a third cross-sectional view, succeeding FIG. 3, of a portion of the method of manufacturing a semiconductor device in accordance with an embodiment of the present invention.

Then, as shown in FIG. 4, an anisotropic etcher is used to perform an anisotropic etching to remove the dielectric film (second dielectric film) 22 that is present at least above the contact region 23. By doing this, a side wall of the wiring region that embeds the excess portion is formed. The dielectric film 22 may be composed of the same material as that of the etching stopper film ES. In this case, the etching time is controlled so as not to destroy the shape of the trench. Although not shown, if the contact region 23 is, for example, a Cu wiring, and a diffusion preventing cap layer is present above the contact region 23, the diffusion preventing cap layer is successively removed.

Figure 5:
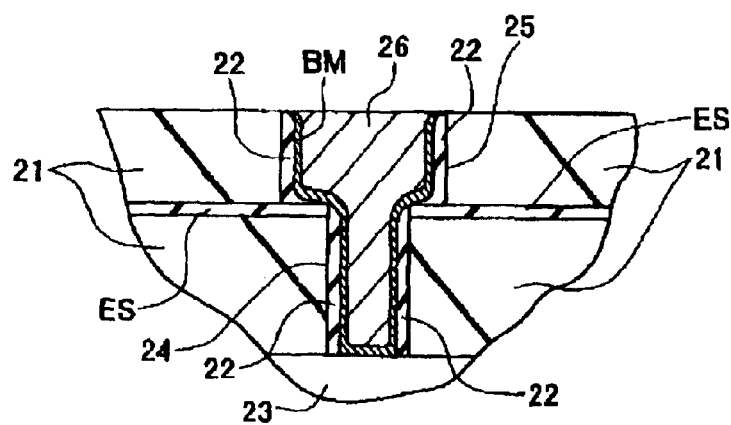
FIG. 5 shows a fourth cross-sectional view, succeeding FIG. 4, of a portion of the method of manufacturing a semiconductor device in accordance with an embodiment of the present invention.

Next, as shown in FIG. 5, a sputter method is used to coat a barrier metal BM on the inside of the wiring region. The barrier metal BM may typically be a TaN film, for example. Also, without being limited to TaN film, a film including any one of Ta, TiN, TiSiN, TiW, WN, WTa, TiN, TiW and WN or a stacked layer of these materials may be used. In addition, depending on the material of the dielectric film 22, a SiOC film formed by a CVD method, or an SiN film may also be used. Also, if the dielectric film 22 is a silicon nitride film that has a good Cu diffusion preventing capability, and if a structure can securely cover the circumference of the Cu wiring member, the formation of the barrier metal BM can be omitted.

Next, a CU wiring member 26 is embedded in the wiring region. For example, a Cu seed layer may be sputter deposited or Cu may be deposited by an electrolytic plating method. As a result, Cu is deposited on the wiring region including the contact region 23 and the wiring trench 25. Then, a chemical mechanical polishing (CMP) technique is performed to provide a configuration in which Cu is embedded in only necessary wiring portions.

Figure 6:
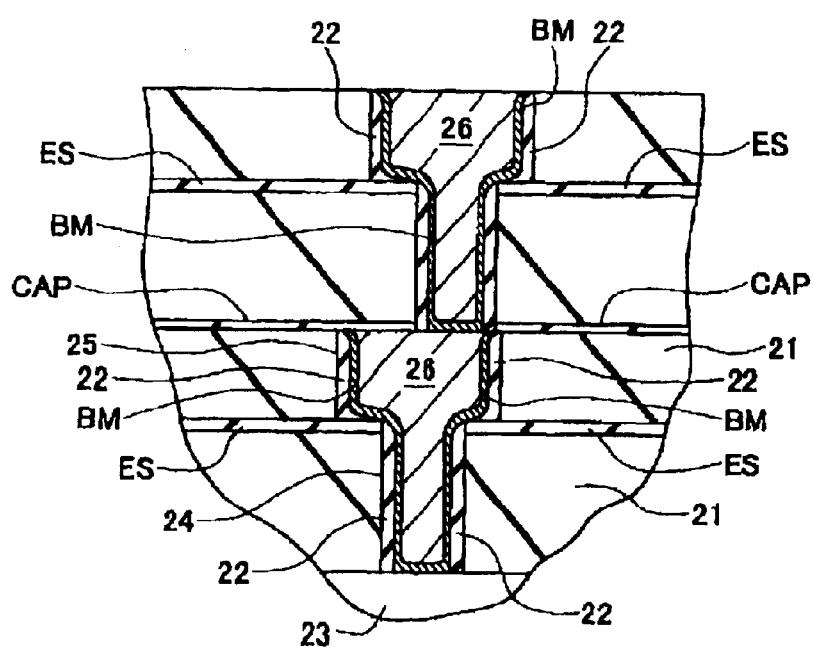
FIG. 6 shows a fifth cross-sectional view, succeeding FIG. 5, of a portion of the method of manufacturing a semiconductor device in accordance with an embodiment of the present invention.

Next, as shown in FIG. 6, a diffusion barrier layer CAP, for example, a film composed of SiN or SiOC is formed by a CVD method over the Cu wiring member 26. Although not shown, the diffusion barrier layer CAP may be formed by oxidizing the Cu wiring member 26 itself to cover only an upper portion of the Cu wiring member 26 with an oxide film.

Then, a specified portion on the Cu wiring member 26 may be defined as a new contact region 23, and a first dielectric film 21, a via hole 24 and a wiring trench 25 connecting to the via hole 24, a second dielectric film 22, a barrier metal BM (that may not be necessary depending on the structures), and an embedded Cu wiring member 26 are formed by a method similar to that shown in FIGS. 2–5. Although not shown, this method is repeated to realize multiple wiring layers with Cu wirings.

In accordance with the embodiment described above, when forming the Cu wiring member (26) in the multiple wiring layers, and when a wiring layer in an upper layer is connected to the Cu wiring member (26) in a lower layer through the via hole 24 formed in the first dielectric film 21 by etching, a substantial amount of matching margin can be expected. In other words, an etching deviation at an edge section of the Cu wiring member 26 can be compensated by the amount of the thickness of the second dielectric film 22. Even when the second dielectric film 22 and the diffusion barrier layer CAP are composed of the same material, the device reliability would not have any problem by performing an etching end point detection. Moreover, the second dielectric film 22 would only embed the excess portion (the outside area of the wiring region), and does not narrow the substantive wiring region. As a result, a highly reliable multiple layered wiring structure with Cu wirings can be realized.

Figure 7:
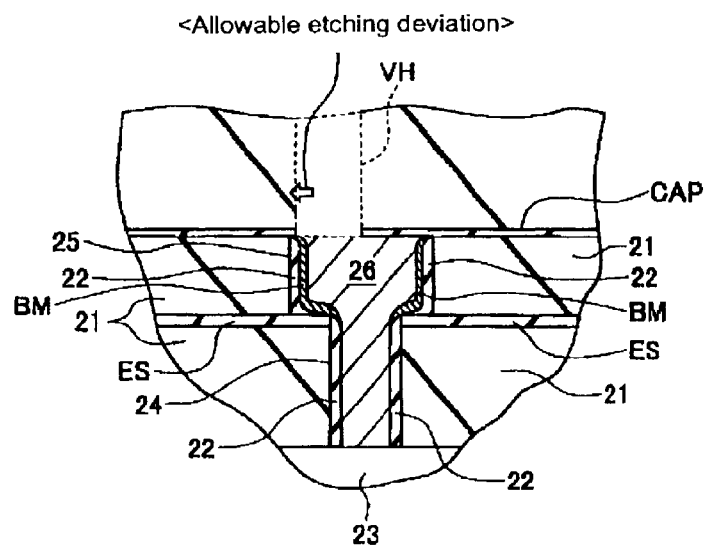
FIG. 7 shows a cross-sectional view of a portion of a method of manufacturing a semiconductor device in accordance with another embodiment of the present invention.

FIG. 7 shows a cross-sectional view of a key portion in a method of manufacturing a semiconductor device in accordance with a more preferred embodiment of the present invention than that shown in FIGS. 2–6. The same reference numbers are used for the same components as those of the above described embodiment. Descriptions will be made with the second dielectric film 22 being a silicon nitride film that is generally recognized for its Cu diffusion prevention capability.

A wiring region that includes an excess portion (a via hole 24 and a wiring trench 25 connecting thereto) that is larger in size by about 10–20% than a substantive wiring region is formed in interlayer dielectric films (first dielectric film) 21 of predetermined kinds described above by using the method shown in FIGS. 8–10, for example. Then, a second dielectric film 22 composed of a silicon nitride film is formed by a plasma CVD method such that the excess portion is embedded, and side walls are left by performing an anisotropic etching.

Then, a barrier metal BM is coated by a sputter method on the inside of the wiring region. Depending on the sputtering conditions, the barrier metal BM is not coated within narrow regions such as the via hole 24. As a result, the barrier metal BM is coated in areas where there is a large amount of filled Cu, and at bottom sections of the wiring trench 25 where the films having a diffusion prevention capability have been thinned due to the previously conducted anisotropic etching. Thereafter, a Cu wiring member 26 is embedded in the wiring region.

Also, by the method of the above-described embodiment, wiring layers in upper layers are similarly, repeatedly formed in forming Cu wiring members in the multiple layer wiring structure. As a result, when an upper layer is connected to the Cu wiring member 26 through the via hole VH formed in the dielectric film 21 by etching, an etching deviation at an edge section of the Cu wiring member 26 can be compensated by the amount of the thickness of the dielectric film 22.

Also, there is provided a structure in which the formation of a coating of the barrier metal BM is avoided on the inside of the via hole 24 that has a narrow connection area because such a coating results in a higher resistance. This is effective for the structure in which the dielectric film 22 has a Cu diffusion preventing capability.

In addition, although not shown, by using a film with a low dielectric constant that has a very slow Cu diffusion rate, such as a BCB (Benzocyclobutene) film, as the dielectric film 21, the formation of the barrier metal BM can be omitted. Alternatively, it can be expected that the dielectric film 22 can be changed from a silicon nitride film to an silicon oxide film.

In each of the embodiments and methods described above, structures in which Cu wiring members containing Cu as the main component are formed as metal wiring members that compose multiple wiring layer structures are indicated. It is expected that the present invention is applied to cases where other metal wiring members are used. Other than Cu wiring members, various metal wiring members, such as, for example, Au, Ag, Al and W may be applicable. In such cases, a barrier metal that is effective to the specific metal may be appropriated selected.

As described above, in accordance with the present invention, a second dielectric film having an etching selection ratio different from that of a first dielectric film is provided on an edge section side wall of a connection region of metal wiring members. By this, when forming metal wiring members, and when a wiring layer in an upper layer is connected to a wiring layer in a lower layer through a via hole formed in the first dielectric film by etching, an etching deviation at an edge section of the lower wiring layer can be compensated by the amount of the thickness of the second dielectric film. As a result, there can be provided a semiconductor device having a highly reliable connecting wiring structure with minute multiple wiring layers composed of embedded metal wiring material which form an integrated circuit, and a method of manufacturing the same.

The entire disclosure of Japanese Patent Application No. 2002-008714 filed Jan. 17, 2002 is incorporated by reference herein.

What is claimed is:

1. A method of manufacturing a semiconductor device formed with circuit wirings including predetermined metal wiring members, the method comprising the steps of:

forming a wiring region including an excess portion that is larger than a substantive wiring region by a predetermined measurement by selectively removing at least a first dielectric film having a first etching selection ratio;

forming a second dielectric film having a second etching selection ratio such that at least the excess portion on a surface in the wiring region is embedded;

conducting anisotropic etching to leave the second dielectric film on a side wall including the excess portion of the wiring region; and embedding the wiring region with a metal wiring member to form a wiring structure.

2. A method of manufacturing a semiconductor device according to claim 1, wherein the step of forming the wiring region includes the step of providing a predetermined region having a configuration with a dual damascene structure, which is accompanied with forming a hole forming configuration toward a conductive region in a lower layer and forming a wiring trench.

3. A method of manufacturing a semiconductor device according to claim 1, wherein the step of forming the wiring region is accompanied by forming a wiring trench, and further comprising the step of providing a predetermined region having a configuration with a dual damascene structure wherein, before forming the wiring trench, a hole forming configuration is formed toward a conductive region in a lower layer, and the hole forming configuration is included in the wiring trench in the step of forming the wiring trench.

4. A method of manufacturing a semiconductor device according to claim 1, wherein the step of forming the wiring region is accompanied by forming a wiring trench, and further comprising the step of providing a predetermined region having a configuration with a dual damascene structure wherein, after the step of forming the wiring trench, a hole forming configuration is formed toward a conductive region in a lower layer in the wiring trench.

5. A method of manufacturing a semiconductor device according to claim 1, wherein, after the step of forming the wiring region, and before the wiring region is embedded with the metal wiring member, the step of coating a barrier metal on a predetermined region including the second dielectric film is conducted.

6. A method of manufacturing a semiconductor device according to claim 1, wherein the step of forming the wiring region is accompanied with forming a hole forming configuration toward a conductive region in a lower layer and a wiring trench, and further comprising, after the step of forming the wiring region and before embedding the wiring region with the metal wiring member, the step of coating a barrier metal on a region including the wiring trench other than the hole forming configuration.

* * * * *